United States Patent
Narazaki

(10) Patent No.: US 8,884,383 B2
(45) Date of Patent: Nov. 11, 2014

(54) SEMICONDUCTOR DEVICE AND METHOD OF TESTING THE SAME

(75) Inventor: Atsushi Narazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 53 days.

(21) Appl. No.: 13/272,512

(22) Filed: Oct. 13, 2011

(65) Prior Publication Data

US 2012/0205756 A1 Aug. 16, 2012

(30) Foreign Application Priority Data

Feb. 16, 2011 (JP) ................. 2011-030756

(51) Int. Cl.
| | | |
|---|---|---|
| H01L 29/84 | (2006.01) | |
| H01L 21/66 | (2006.01) | |
| G01R 31/28 | (2006.01) | |
| H01L 23/00 | (2006.01) | |
| H01L 23/31 | (2006.01) | |

(52) U.S. Cl.
CPC ............ *H01L 22/14* (2013.01); *G01R 31/2884* (2013.01); *H01L 2224/48247* (2013.01); *H01L 24/73* (2013.01); *H01L 22/12* (2013.01); *H01L 2924/1203* (2013.01); *H01L 2924/014* (2013.01); *H01L 2924/13091* (2013.01); *H01L 2224/73265* (2013.01); *H01L 2224/32245* (2013.01); *H01L 2924/13055* (2013.01); *H01L 23/3121* (2013.01); *H01L 24/32* (2013.01)
USPC .......................................... 257/417; 257/415

(58) Field of Classification Search
USPC ........... 257/417, E21.529, E21.521, E29.324, 257/415, E21.531
See application file for complete search history.

(56) References Cited

U.S. PATENT DOCUMENTS

| 4,739,381 A | * | 4/1988 | Miura et al. ................... 257/417 |
| 4,881,056 A | * | 11/1989 | Mizukoshi et al. ............... 338/4 |
| 6,807,503 B2 | * | 10/2004 | Ye et al. ......................... 702/117 |
| 2003/0030141 A1 | * | 2/2003 | Araki et al. .................... 257/720 |
| 2005/0001487 A1 | | 1/2005 | Ausserlechner |

FOREIGN PATENT DOCUMENTS

| CN | 1508882 A | 6/2004 | |
| JP | 58056367 A | * 4/1983 | ............. H01L 29/84 |
| JP | 58-200549 | 11/1983 | |

(Continued)

OTHER PUBLICATIONS

Hiroaki Tanaka, et al., "Mechanical stress dependence of power device electrical characteristics," Reference of joint meeting of Institute of Electrical Engineers of Japan, 2006, pp. 31-36.

Hiroyuki Takase, et al., "TEG Solution that Supports High Density Mounting Technology Development,", Hitachi Hyoron, vol. 91, No. 05, May 2009, pp. 64-67.

(Continued)

*Primary Examiner* — Long K Tran
*Assistant Examiner* — Jordan Klein
(74) *Attorney, Agent, or Firm* — Oblon, Spivak, McClelland, Maier & Neustadt, L.L.P.

(57) ABSTRACT

A semiconductor device includes a semiconductor chip with a gate electrode, and a stress detecting element placed on a surface of the semiconductor chip, and which detects stress applied to the surface. The semiconductor device controls a control signal to be applied to the gate electrode in response to stress detected by the stress detecting element. The stress detecting element is preferably provided as a first stress detecting element which detects stress applied to a central portion of the semiconductor chip in plan view. The stress detecting element is preferably provided as a second stress detecting element which detects stress applied to a circumferential portion of the semiconductor chip in plan view.

9 Claims, 14 Drawing Sheets

(56) References Cited

FOREIGN PATENT DOCUMENTS

| | | | |
|---|---|---|---|
| JP | 61-248482 A | 11/1986 | |
| JP | 62-252152 | 11/1987 | |
| JP | 03-231158 | 10/1991 | |
| JP | 06-112121 | 4/1994 | |
| JP | 2002-270856 | 9/2002 | |
| JP | 2005-209827 | 8/2005 | |
| JP | 2005-322781 | 11/2005 | |
| JP | 2005322781 A * | 11/2005 | ............. H01L 29/78 |
| JP | 2005-333093 | 12/2005 | |
| JP | 2006-040917 | 2/2006 | |
| JP | 2007-042710 | 2/2007 | |
| JP | 2007-194530 | 8/2007 | |
| JP | 2007-227794 | 9/2007 | |
| JP | 2008-305984 | 12/2008 | |

OTHER PUBLICATIONS

Office Action issued on Jan. 29, 2014 in the counterpart Korean Patent Application No. 10-2012-0010589 (with partial English Translation).

Notification of Reason for Refusal dated Mar. 4, 2014 in Japanese Application No. 2011-030756 w/partial English translation.

Chinese Office Action dated Mar. 3, 2014 in Chinese Patent Application No. 201110359048.8 w/partial English translation.

Office Action issued Jun. 3, 2014 in German Patent Application No. 10 2011 087 149.7 (with English Translation).

Office Action issued Aug. 21, 2014 in Korean Patent Application No. 10-2012-0010589 (with partial English Translation).

Office Action issued Aug. 8, 2014 in Chinese Patent Application No. 201110359048.8 (with partial English Translation).

* cited by examiner

F I G. 4 A
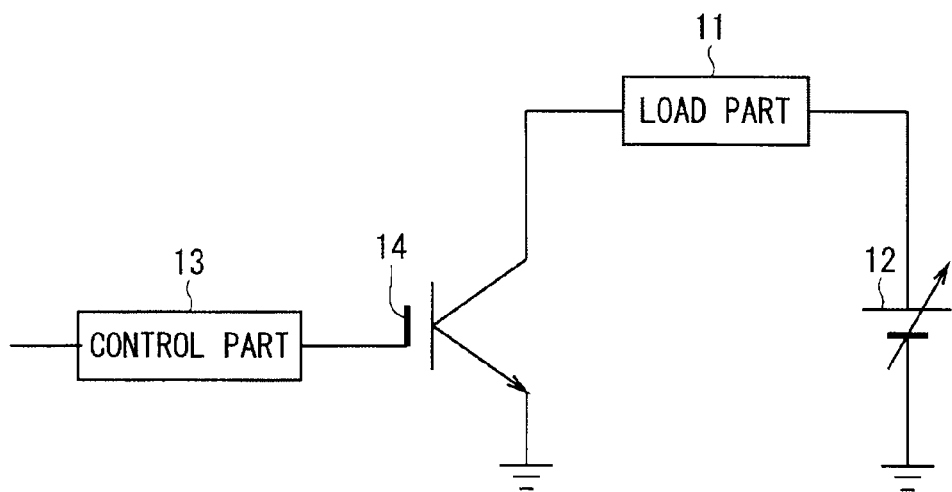
F I G. 4 B
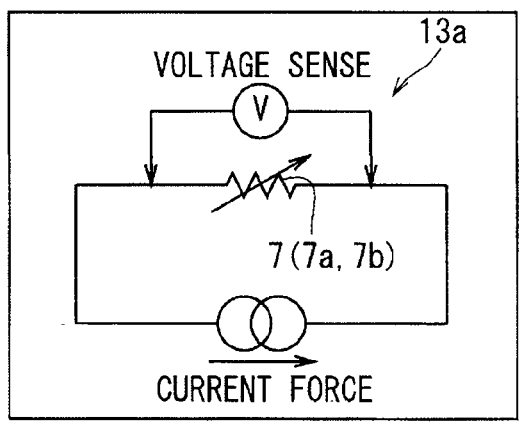

F I G. 6 A
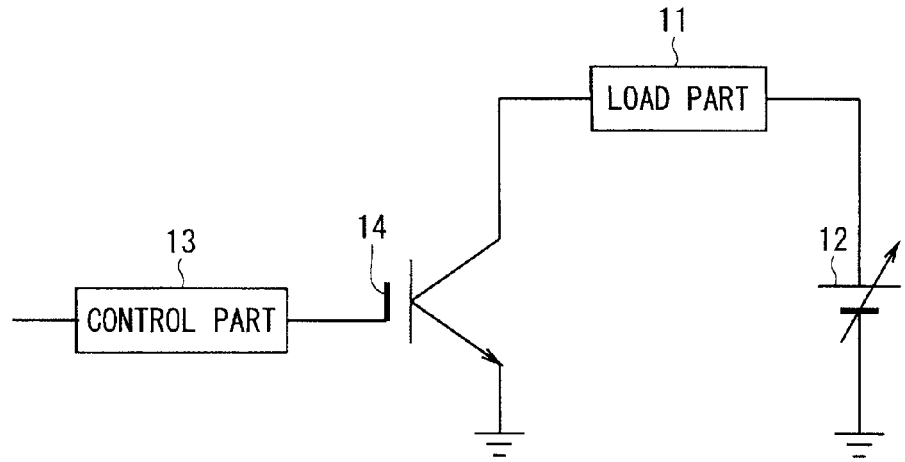
F I G. 6 B
|ΔV1−ΔV2|>THRESHOLD VOLTAGE
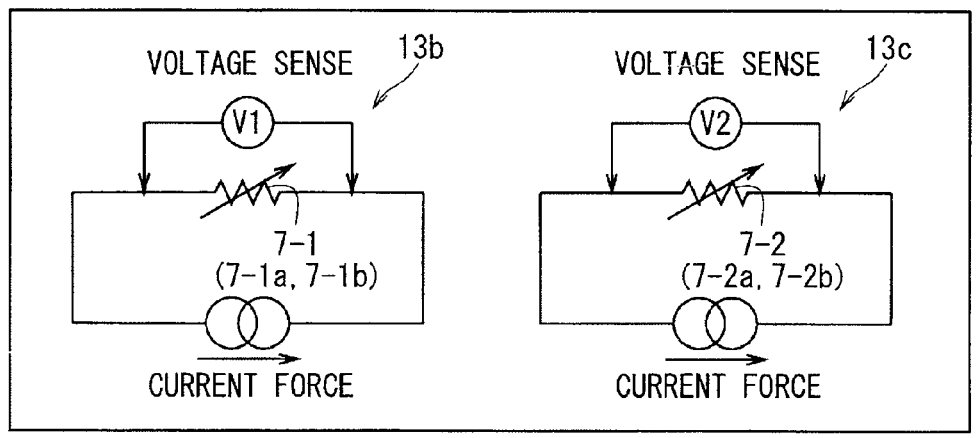

F I G. 7
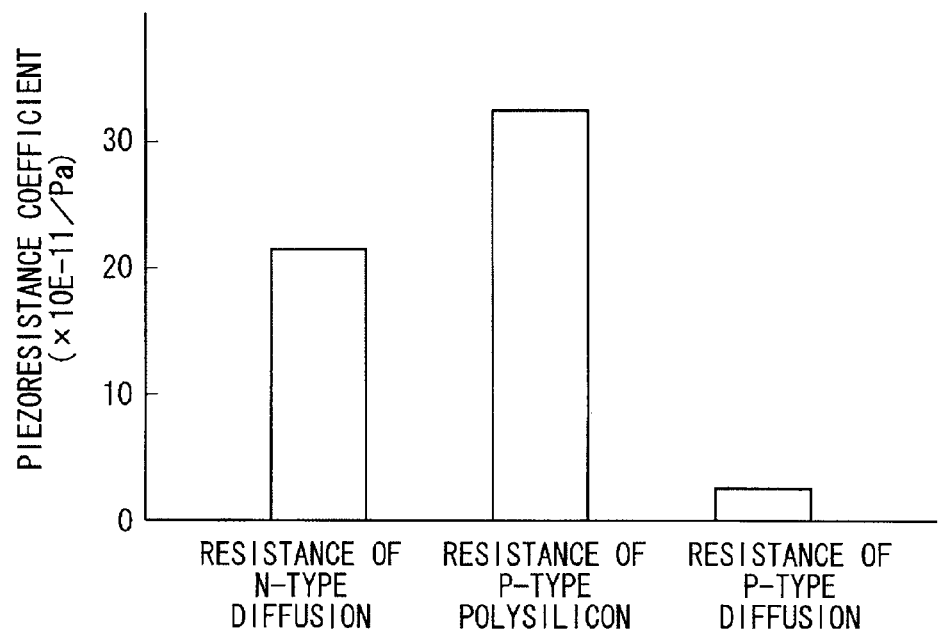
F I G. 8
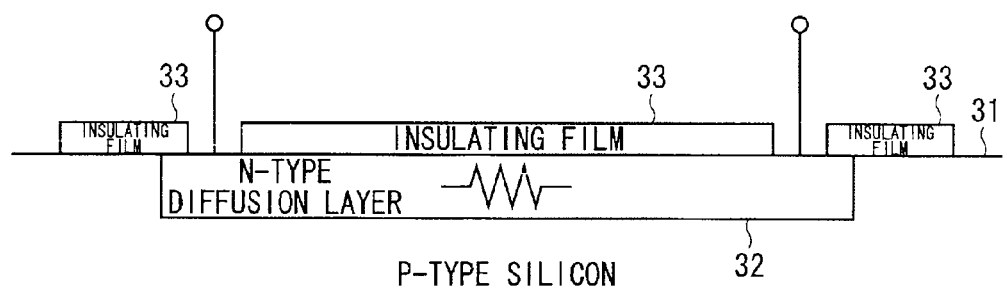

F I G. 1 1
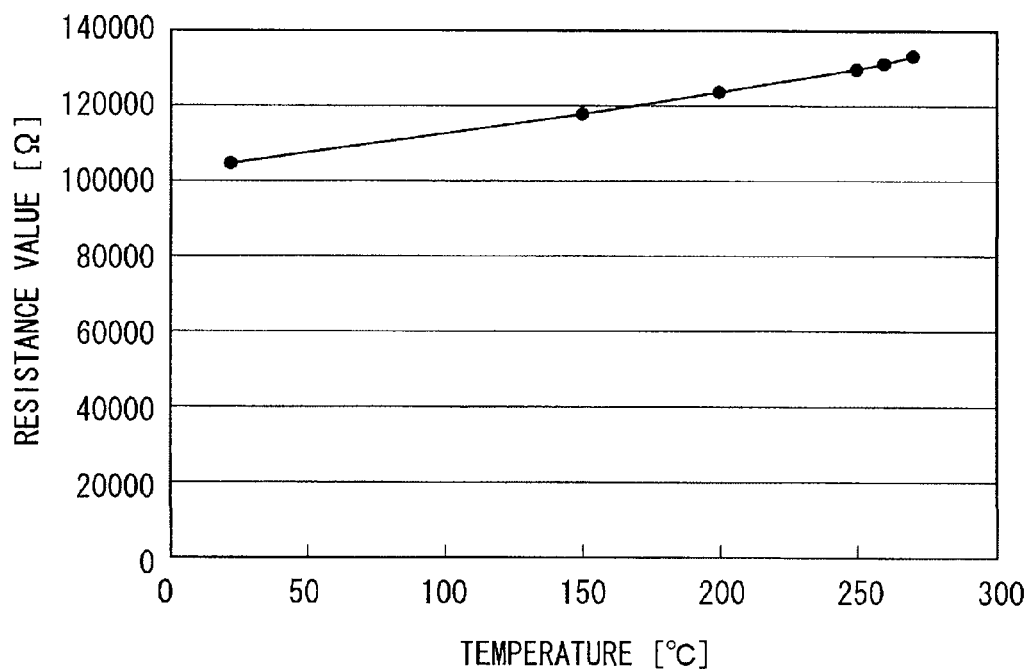

F I G. 1 2
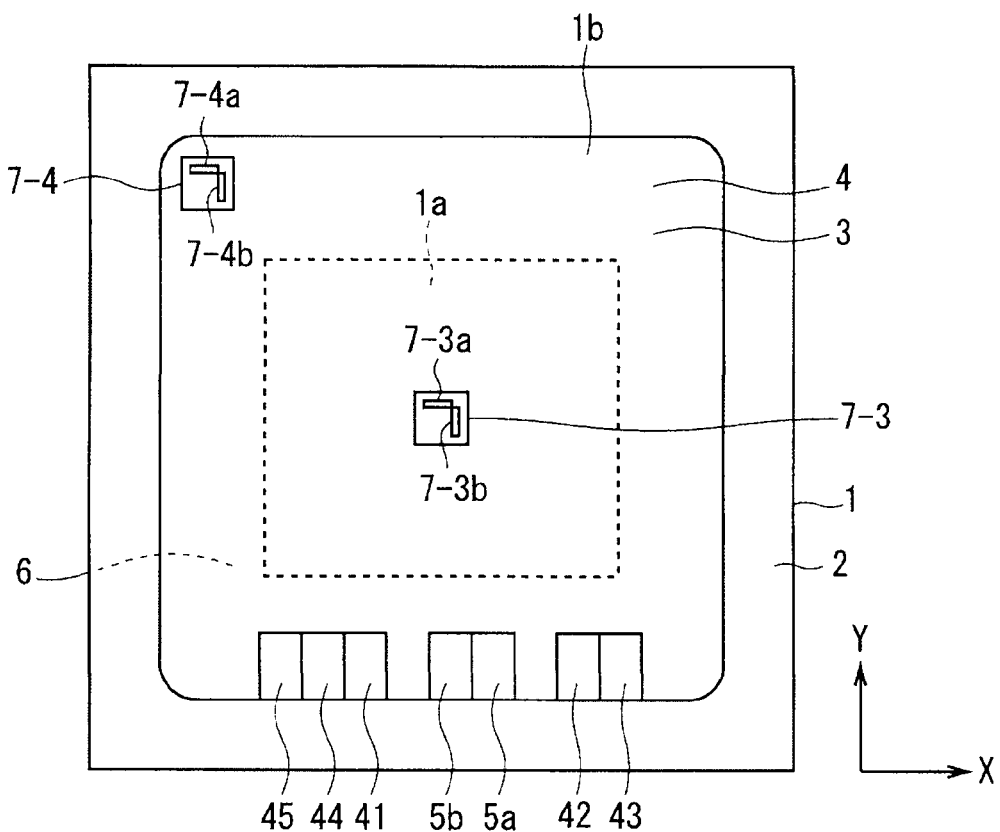

F I G. 1 3
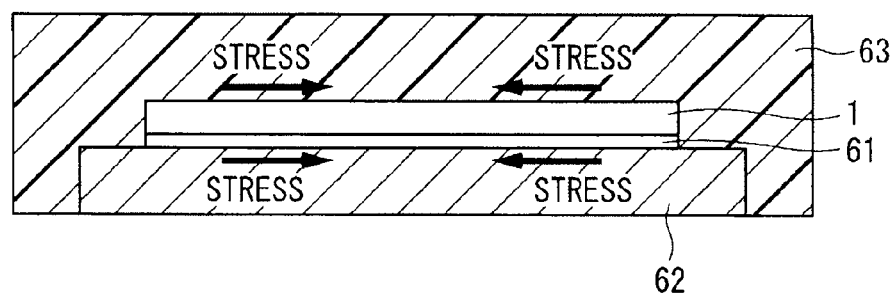
F I G. 1 4
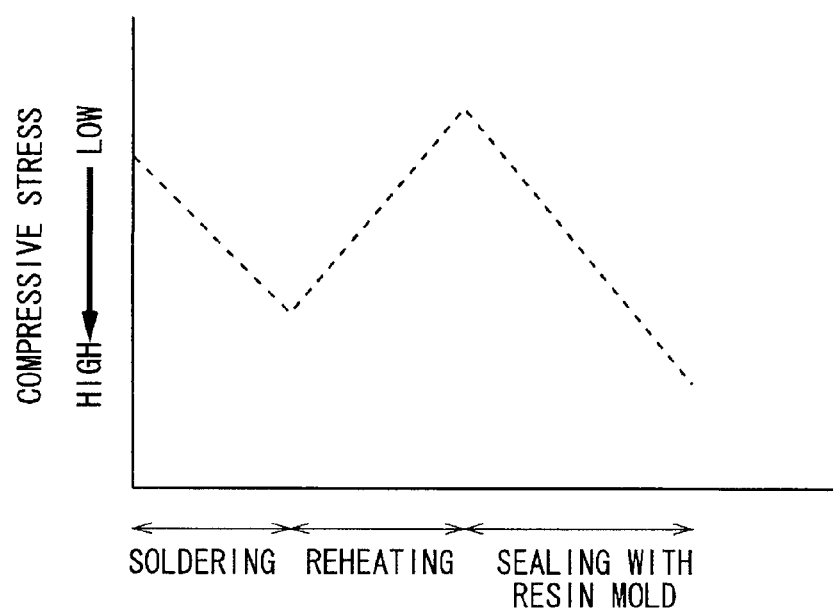

F I G. 1 9
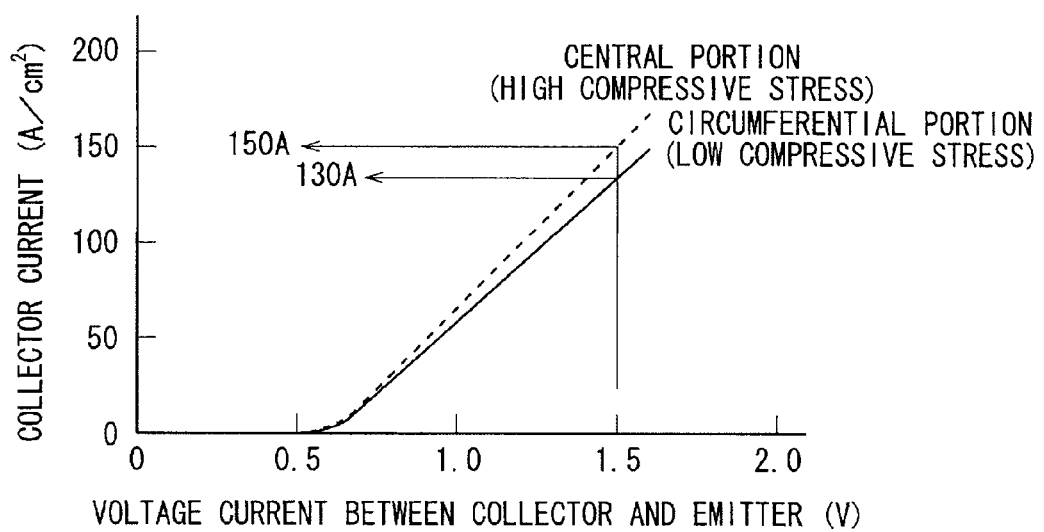

US 8,884,383 B2

1

SEMICONDUCTOR DEVICE AND METHOD OF TESTING THE SAME

BACKGROUND OF THE INVENTION

1. Field of the Invention

The present invention relates to a semiconductor device and a method of testing the semiconductor device.

2. Description of the Background Art

Power devices functioning as power semiconductor elements have been applied as contactless switches for controlling high-capacity power in inverter circuits of household electric appliances such as air conditioners, refrigerators and washers for which energy saving has been promoted. These power devices have also been applied for motor control of electric trains such as the bullet trains and subway trains. In recent years, these power devices have been applied in a wider range of fields in consideration especially of the Earth's environment, and have been used as those for controlling inverters and converters of hybrid cars that use electricity and engines in combination, and as converters for photovoltaic power generation and wind power generation. A semiconductor chip including these power devices is disclosed for example in Japanese Patent Application Laid-Open No. 2005-322781.

A technique to reduce the thickness of a semiconductor chip is mainly employed to enhance the electric characteristics of the semiconductor chip. However, thickness reduction of a semiconductor chip results in variations of stress applied in the plane of the semiconductor chip, and these variations make the nonuniformity of the electric characteristics more series in the plane. The serious nonuniformity of the electric characteristics causes a large current to flow partially in the semiconductor chip. So, heat with a high heating value is generated in the part where the large current flows, resulting in a fear of shortened lifetime of a semiconductor device. Also, it has been impossible to determine if quality degradation generated during a high-temperature storage test or during a power cycle test is due to stress, or failure during manufacture of chips.

SUMMARY OF THE INVENTION

It is an object of the present invention to provide a technique capable of suppressing flow of a large current partially in a semiconductor chip, and capable of eliminating influence to be exerted by stress generated during a test.

The present invention is intended for a semiconductor device including a semiconductor chip with a control electrode, and a stress detecting element placed on a surface of the semiconductor chip, and which detects stress applied to the surface. The semiconductor device controls a control signal to be applied to the control electrode in response to stress detected by the stress detecting element.

The gate signal of a switching element is controlled in response to stress of the semiconductor chip detected by the stress detecting element. This suppresses flow of a large current in a part of the semiconductor chip subjected to application of high stress. Thus, heat with a high heating value will not be generated in this part, resulting in extended lifetime of the semiconductor device.

These and other objects, features, aspects and advantages of the present invention will become more apparent from the following detailed description of the present invention when taken in conjunction with the accompanying drawings.

2

Figure 2:
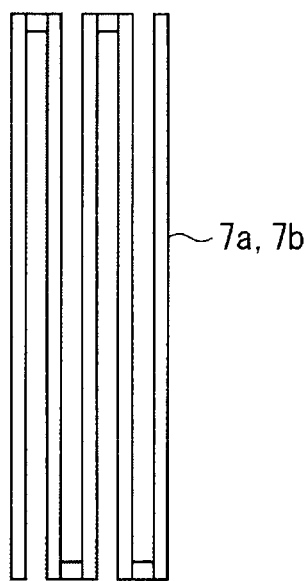
Figure 3:
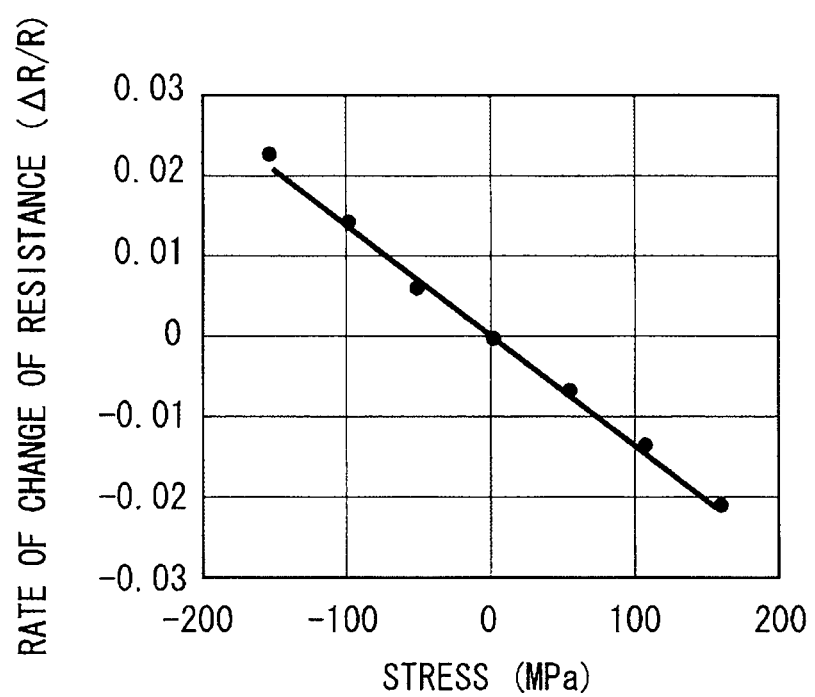
Figure 5:
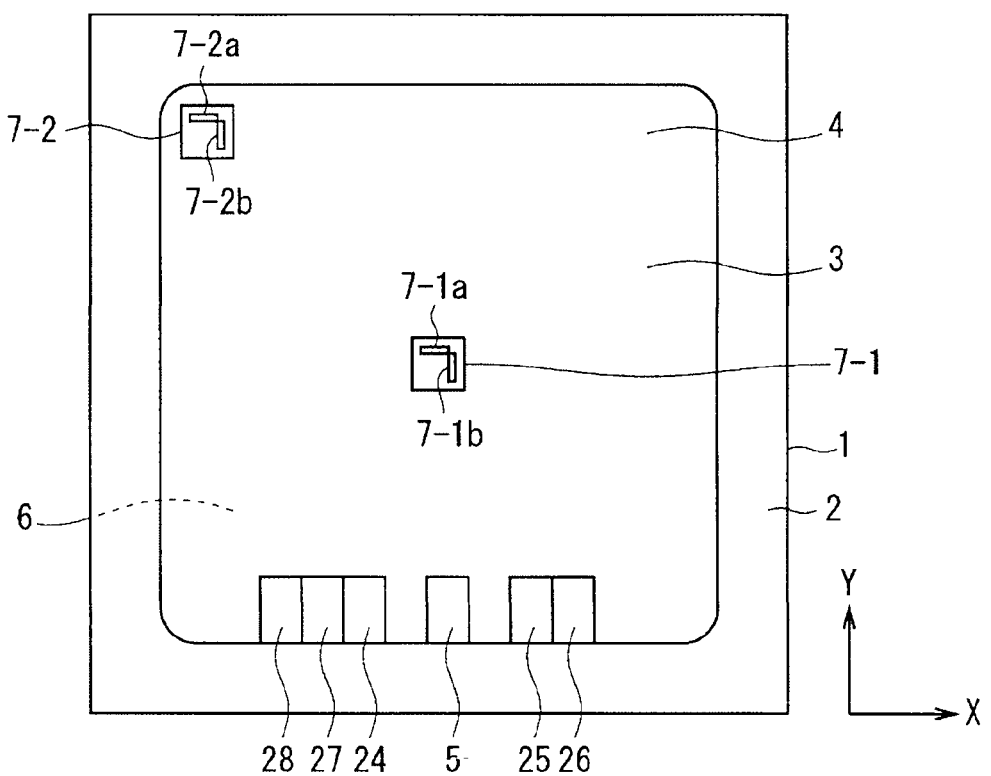
Figure 9:
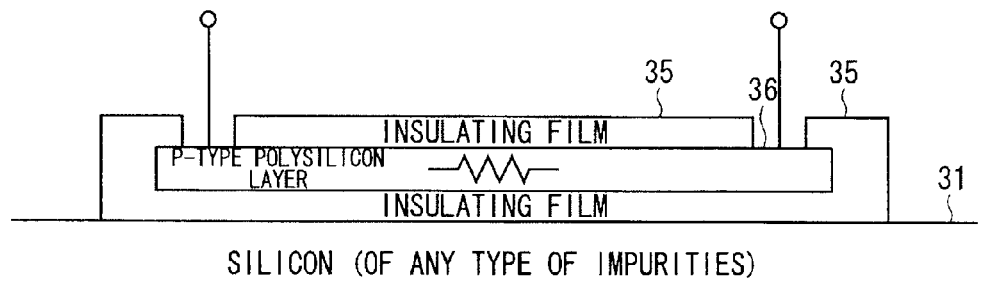
Figure 10:
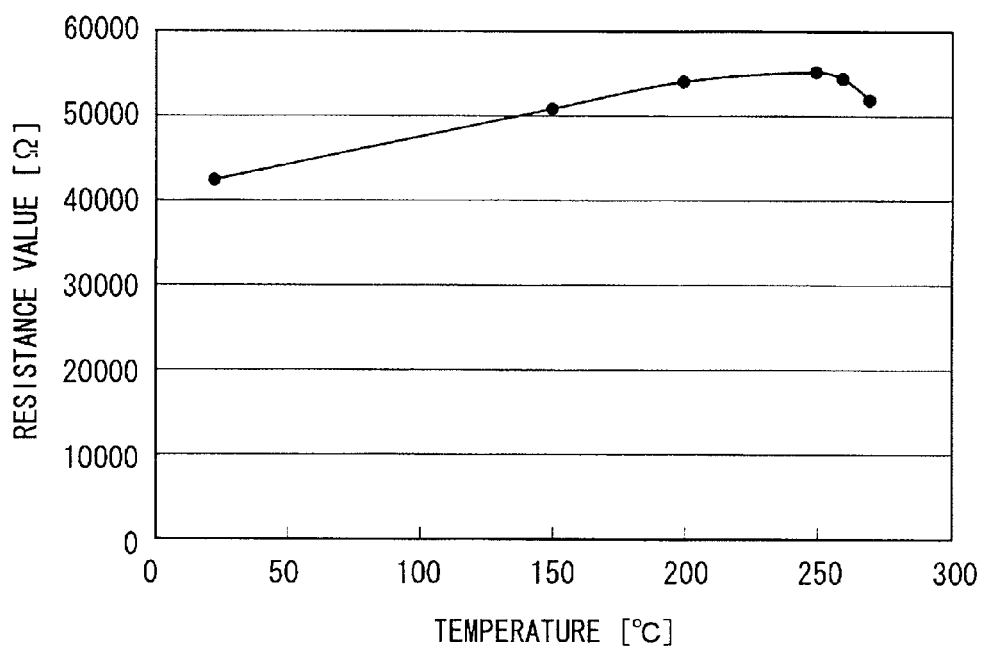
Figure 15:
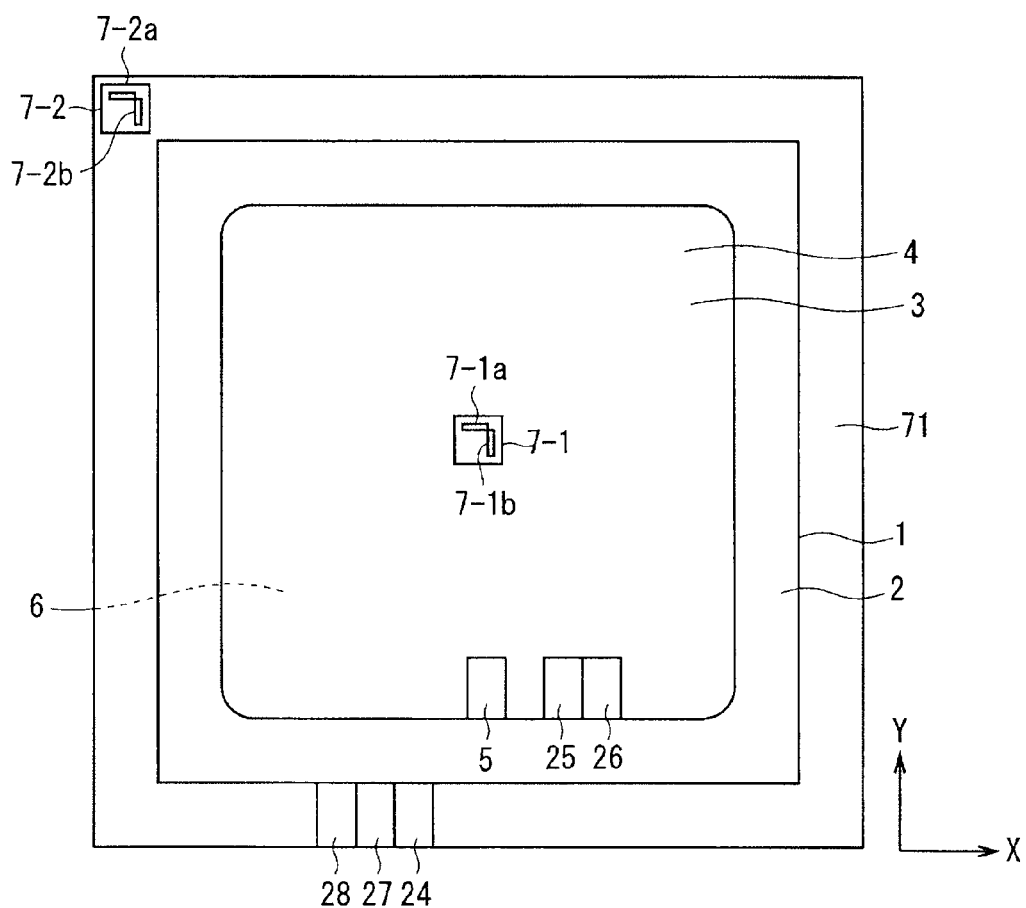
Figure 16:
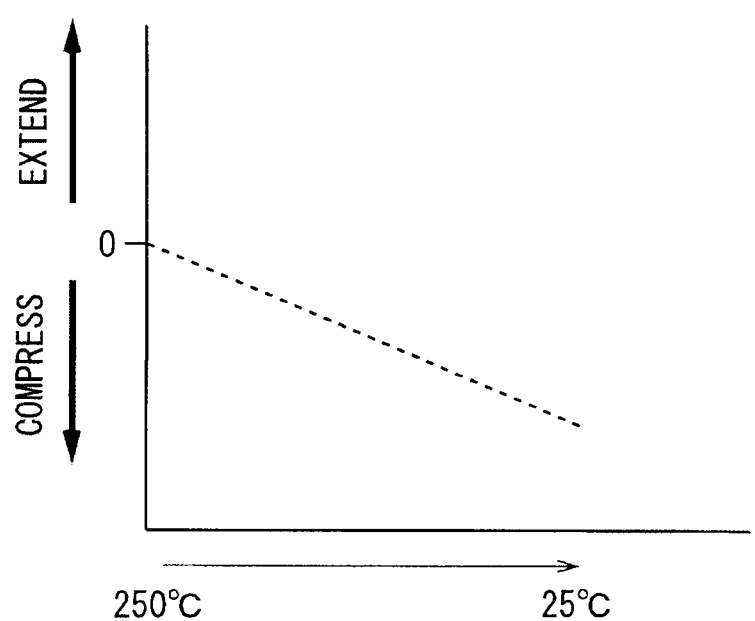
Figure 17B:
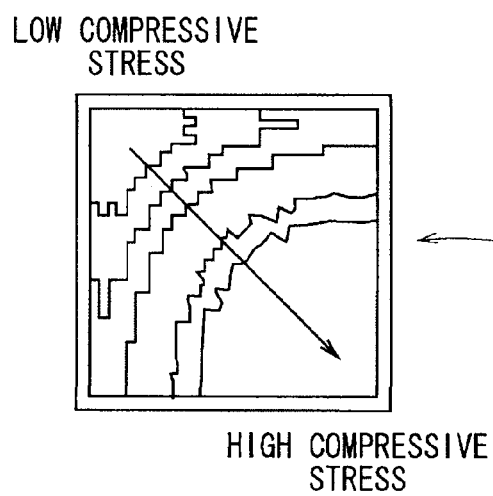
Figure 17A:
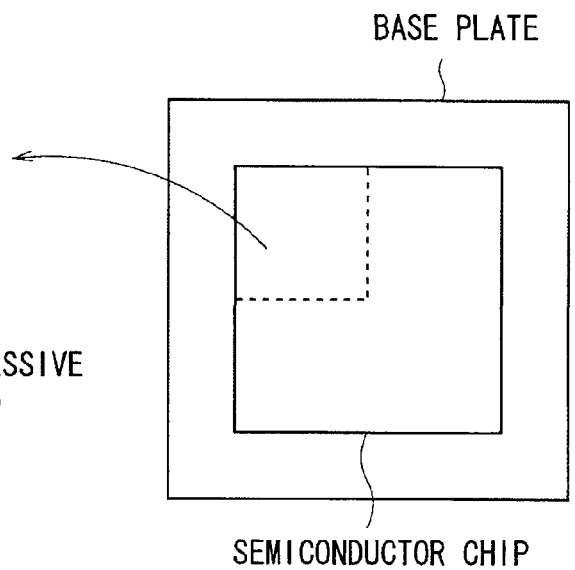
Figure 18:
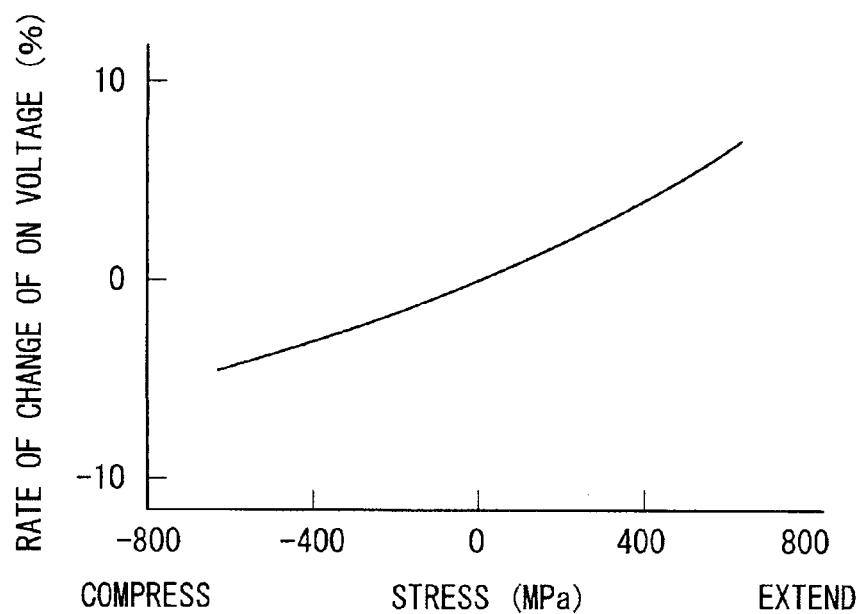

FIG. 2 shows the structure of a piezoresistive element;

FIG. 3 explains a relationship between stress applied to a piezoresistive element, and the rate of change of the resistance value of the piezoresistive element;

FIGS. 4A and 4B each show the circuit structure of the semiconductor device of the first preferred embodiment;

FIG. 5 is a top view of the structure of a semiconductor chip provided in a semiconductor device of a second preferred embodiment;

FIGS. 6A and 6B each show the circuit structure of the semiconductor device of the second preferred embodiment;

FIG. 7 shows the types of resistor of a piezoresistive element, and the coefficients of resistance thereof in association with each other;

FIGS. 8 and 9 are each a sectional view of the structure of a semiconductor chip provided in a semiconductor device of a fourth preferred embodiment;

FIG. 10 explains a relationship between the resistance value of a piezoresistive element including a diffusion layer and temperature;

FIG. 11 explains a relationship between the resistance value of a piezoresistive element including a polysilicon layer and temperature;

FIG. 12 is a top view of the structure of a semiconductor chip provided in a semiconductor device of a fifth preferred embodiment;

FIG. 13 is a sectional view of the structure of a semiconductor device of a sixth preferred embodiment;

FIG. 14 shows stress applied to a semiconductor chip;

FIG. 15 is a top view of a wafer provided with a semiconductor chip of a seventh preferred embodiment;

FIG. 16 explains a relationship between stress applied to a semiconductor chip and temperature;

FIGS. 17A and 17B are each a distribution map showing the magnitude of stress applied to a semiconductor chip;

FIG. 18 shows how stress affects the electric characteristics of a semiconductor chip; and FIG. 19 explains a relationship between variations in electric characteristics, and change of the value of a current flowing between a collector and an emitter.

EMBODIMENT FOR CARRYING OUT THE INVENTION

<First Preferred Embodiment>

A semiconductor device related to a semiconductor device of a first preferred embodiment of the present invention (hereinafter called "related semiconductor device") is described before the description of the semiconductor device of the first preferred embodiment. The related semiconductor device includes a semiconductor chip with a typical low-loss IGBT (insulated gate bipolar transistor) for controlling a large current. The IGBT includes gate and emitter electrodes arranged on the front side of a wafer to become a semiconductor chip, and a collector electrode on the rear side of the wafer.

The operation of the generally employed IGBT during its turn-on is described next. When a positive voltage of a sufficient level (+15 V, for example) is applied between the gate and the emitter, an MOSFET on the front surface and forming the IGBT is turned on. Then, a forward bias is applied between a P+ layer near the collector and an N− layer of a drift layer that is nearer the front surface than the P+ layer, thereby injecting positive holes from the P+ layer into the N− layer. Electros in the same number as that of the positive charges of the positive holes injected in the N− layer gather in the N-drift layer. This reduces the resistance of the N-drift layer (generates conductivity modulation), thereby turning the IGBT on to allow flow of a current.

The operation of the IGBT during its turn-off is described below. Application of a voltage lower than the aforementioned positive voltage between the gate and the emitter turns the aforementioned MOSFET off. Then, injection of positive holes from the P+ layer near the collector stops to make the N− drift layer depleted. Positive holes already injected move to the emitter, thereby turning the IGBT off to interrupt a current.

The aforementioned reduction of the resistance of the N− drift layer (conductivity modulation) during on state means resistance reduction of the device, and a voltage applied at this time between the collector and the emitter is called "ON voltage" or "VCE (sat)."

A current is caused to flow by residual positive holes when the IGBT is switched from the turn-on to the turn-off described above. This current flow is needless power consumption that is what is called switching loss. So, if positive holes and electrons (they may be called "carriers" collectively) are injected in larger quantities into the N− drift layer for resistance reduction of the IGBT, switching loss increases due to residual carriers when the IGBT is switched to the turn-off. This means that there is a tradeoff between the reduction of the ON voltage and the reduction of switching loss.

In order to enhance such tradeoff characteristics, transistor cells may be arranged with higher density in the semiconductor chip by employing a technique for finer scales, or the semiconductor chip (semiconductor substrate) may be reduced in thickness in the related semiconductor device. To be specific, reduction in thickness of the semiconductor chip reduces a resistance (ON voltage) between the collector and the emitter, thereby making it possible to reduce loss during conduction of electricity.

Thus, thickness reduction of a semiconductor chip (semiconductor substrate) is desired in order to reduce loss during conduction of electricity and to enhance electric characteristics. However, making the semiconductor chip thinner increases stress to be generated in the semiconductor chip during a process of assembling the semiconductor chip into a package, during soldering after the assembly, and during sealing with a resin mold. This is discussed for example in "Dependence of electric characteristic of power device on mechanical stress" (pp. 31-36, issued in 2006) provided by a society for joint study of the Institute of Electrical Engineers. As a result, stress of the semiconductor chips largely affects the electric characteristics of the semiconductor chip.

FIG. 16 shows stress applied to a semiconductor chip after soldering is performed during assembly. As shown in FIG. 16, stress applied to the semiconductor chip is zero at 250° C. when the semiconductor chip is placed on a base plate for assembly and solder is melted. However, the stress (here, compressive stress) increases as the solder is cooled and solidified.

FIGS. 17A and 17B are each a distribution map obtained by analyzing the magnitude of stress by simulation applied to a semiconductor chip after being subjected to soldering. FIG. 17B shows a stress distribution in a quarter of the semiconductor chip at the upper left that is one of parts of the square (rectangular) semiconductor chip (FIG. 17A) divided vertically and horizontally. That is, the lower right of FIG. 17B corresponds to a central portion of the semiconductor chip, and stress applied thereto is shown in the form of constant-pressure lines. As shown in this view, stress is not applied uniformly in the plane of the semiconductor chip. The stress (here, compressive stress) becomes the highest at the central portion of the semiconductor chip, and decreases toward a circumferential portion of the semiconductor chip. Although not shown, the stress distribution is the same in a quarter of the semiconductor chip at the other parts (upper right, lower left, and lower right parts).

FIG. 18 shows how stress affects the electric characteristics of a semiconductor chip. It is seen from FIG. 18 that application of stress of for example about 500 Mpa to the semiconductor chip makes the ON voltage of the semiconductor chip fluctuate by 3% or more.

FIG. 19 shows how the value of a current flowing between the collector and the emitter of a semiconductor chip changes in response to fluctuations of the ON voltage. It is seen from FIG. 19 that, while a current of 150 A flows in an IGBT at a central portion of the semiconductor chip subjected to application of high compressive stress, a current only of 130 A flows in an IGBT at a circumferential portion of the semiconductor chip subjected to application of low compressive stress, for example.

As described above, thickness reduction of a semiconductor chip results in application of high stress to a central portion of the semiconductor chip, making variations of stress wider in the plane of the semiconductor chip. This may result in a wider range of variations of the ON voltage in the plane of the semiconductor chip. Variations of the stress result not only in the change of the ON voltage but also in the change of a gate threshold voltage (Vth). Such nonuniformity of electric characteristics (ON voltage, gate threshold voltage) in the plane of the semiconductor chip causes a large current to flow partially in the semiconductor chip. So, heat with a high heating value is generated in the part where the large current flows, resulting in a fear of shortened lifetime of a semiconductor device. The semiconductor device of the first preferred embodiment described in detail below is capable of solving the aforementioned problems.

Figure 1:
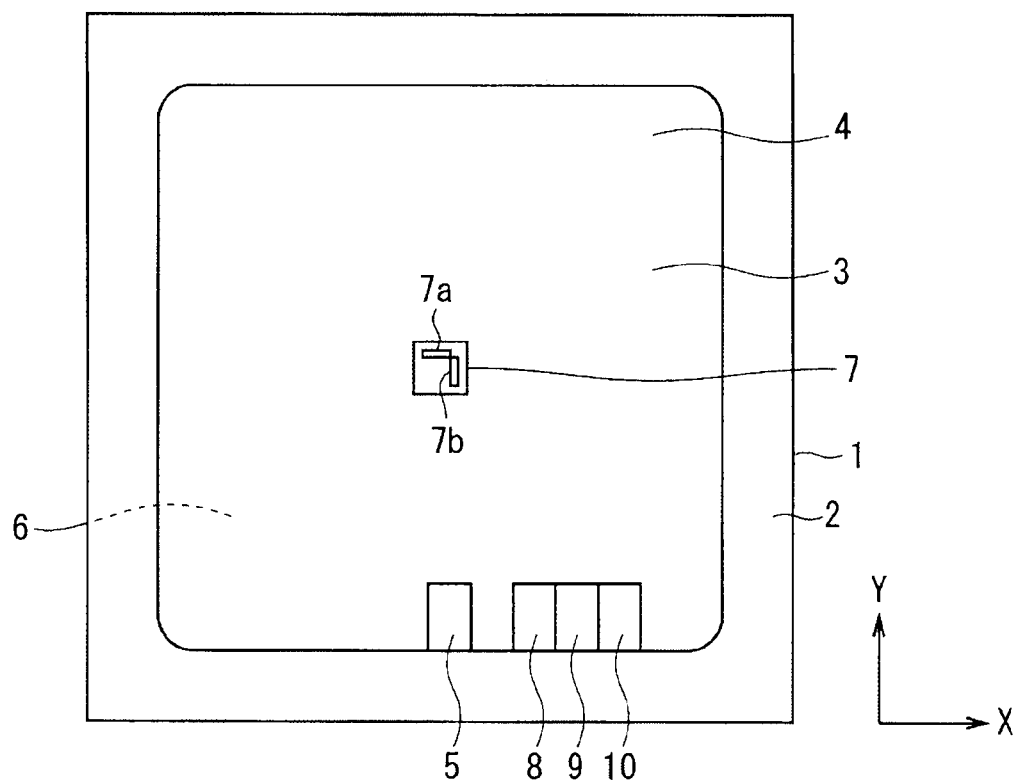
FIG. 1 is a top view of the structure of a semiconductor chip provided in a semiconductor device of a first preferred embodiment.

FIG. 1 is a top view of the structure of a semiconductor chip provided in the semiconductor device of the first preferred embodiment of the present invention. The semiconductor device includes a semiconductor chip 1 with a gate electrode 5 that functions as a control electrode shown in FIG. 1. For the convenience of description, the semiconductor chip 1 is shown to include an IGBT with the gate electrode 5.

The semiconductor chip 1 has a termination region 2 defined at a circumferential portion of the semiconductor chip 1 and in which the breakdown voltage of the IGBT is maintained, and a transistor cell region 3 surrounded by the termination region 2 and in which the IGBT is formed. In the first preferred embodiment, the semiconductor chip 1 is in the shape of a square (rectangle) with two sides extending in the direction of an X axis, and two sides extending in the direction of a Y axis in plan view.

An emitter electrode 4 and the gate electrode 5 of the IGBT are arranged on the front side of the transistor cell region 3, and a collector electrode 6 of the IGBT is arranged on the rear side of the transistor cell region 3.

A stress detecting element 7 for detecting stress applied to a surface of the semiconductor chip 1 is placed on this surface of the semiconductor chip 1 (transistor cell region 3). In the first preferred embodiment, the stress detecting element 7 is placed at a central portion of the semiconductor chip 1. Stress of a relatively large magnitude is applied to the central portion of the semiconductor chip 1 as already mentioned. So, placing the stress detecting element 7 at the central portion makes it possible to detect stress applied to the front surface of the semiconductor chip 1 with satisfactory sensitivity. The stress detecting element 7 is electrically insulated from the emitter, gate and collector electrodes 4, 5 and 6.

The stress detecting element 7 includes piezoresistive elements 7a and 7b that change in resistance in response to stress applied to the surface of the central portion of the front surface of the semiconductor chip 1. The piezoresistive element 7a detects stress applied in the direction of the X axis, and the piezoresistive element 7b detects stress applied in the direction of the Y axis. So, the stress detecting element 7 can detect stress applied in each of the directions of the X and Y axes.

FIG. 2 shows the structure of a piezoresistive element applied as the piezoresistive elements 7a and 7b. The piezoresistive element shown in FIG. 2 is folded at the top and the bottom in plan view, so it is relatively long in the entire longitudinal direction. As a result, this piezoresistive element has high sensitivity in a certain direction (longitudinal direction of FIG. 2). In the first preferred embodiment, the piezoresistive element of FIG. 2 is placed such that the direction of high sensitivity coincides with the direction of the X axis to function as the piezoresistive element 7a. The piezoresistive element of FIG. 2 is also placed such that the direction of high sensitivity coincides with the direction of the Y axis to function as the piezoresistive element 7b.

FIG. 3 explains a relationship between stress applied to the piezoresistive elements 7a and 7b, and the rates of change of the resistance values of the piezoresistive elements 7a and 7b. If this relationship is obtained in advance, stress applied to the semiconductor chip 1 can be measured by measuring the rates of change of the resistance values of the piezoresistive elements 7a and 7b.

The semiconductor chip 1 shown in FIG. 1 includes terminals 8, 9 and 10 provided for measuring the resistance values of the piezoresistive elements 7a and 7b (stress detecting element 7). By way of example, the terminal 8 is a ground terminal, the terminal 9 is a terminal for measuring the resistance of the piezoresistive element 7a that detects stress applied in the direction of the X axis, and the terminal 10 is a terminal for measuring the resistance of the piezoresistive element 7b that detects stress applied in the direction of the Y axis.

FIGS. 4A and 4B each show the circuit structure of the semiconductor device of the first preferred embodiment. As shown in FIG. 4A, the semiconductor device of the first preferred embodiment includes a load part 11, a power supply 12, a control part 13, and a switching element 14. In the first preferred embodiment, the load part 11 and the switching element 14 form the semiconductor chip 1, and the switching element 14 and the gate electrode thereof correspond to the aforementioned IGBT and the gate electrode 5 respectively.

As shown in FIG. 4A, the load part 11 has one end connected to the power supply 12, and the opposite end connected to the collector of the switching element 14. The switching element 14 has the gate electrode connected to the control part 13, and an emitter that is grounded.

The switching element 14 controls conduction of the load part 11 of the semiconductor chip 1 in response to a gate signal described below given from the control part 13.

The semiconductor device of the first preferred embodiment controls the gate signal (control signal) to be applied to the gate electrode (control electrode) of the switching element 14 based on stress detected by the stress detecting element 7. The control of the gate signal mentioned here includes change of the level of the gate signal, or stop of application of the gate signal. In the first preferred embodiment, the control part 13 described in detail below is responsible for this control.

The control part 13 of the first preferred embodiment includes a stress acquiring part 13a for acquiring change in resistance corresponding to stress detected by the stress detecting element 7 as voltage change ΔV. An example of the specific circuit structure of the stress acquiring part 13a is shown in FIG. 4B. The control part 13 can monitor the changes of resistance values of the piezoresistive elements 7a and 7b by making the stress acquiring part 13a acquire voltage change during passage of a current, for example.

The control part 13 controls the gate signal of the switching element 14 if the voltage change ΔV acquired by the stress acquiring part 13a is higher than a fixed amount of voltage change (threshold voltage), namely if stress detected by the stress detecting element 7 is higher than a predetermined threshold. In the first preferred embodiment, the control part 13 controls the gate signal of the switching element 14 if voltage change at either the piezoresistive element 7a or 7b is higher than the fixed amount of voltage change (threshold voltage).

The aforementioned semiconductor device of the first preferred embodiment controls the gate signal in response to stress of the semiconductor chip 1 detected by the stress detecting element 7. This suppresses flow of a large current in a part of the semiconductor chip 1 subjected to application of high stress. Thus, heat with a high heating value is not generated in this part, so that lifetime can be made longer. Stress applied to the semiconductor chip 1 can be measured even when the semiconductor chip 1 is conducting. So, the semiconductor device of the first preferred embodiment is applied effectively in a case where stress changes transiently during large-current switching, for example. Further, the semiconductor device of the first preferred embodiment can conduct a test while controlling the control signal, so that stress generated in this test will not exert any influence.

The stress detecting element 7 of the first preferred embodiment includes the piezoresistive elements 7a and 7b. So, the stress detecting element 7 can also be formed during the flow of forming the semiconductor chip 1, thereby simplifying the manufacturing process.

The semiconductor chip 1 of the first preferred embodiment is described as including the IGBT, but this is not the only example. The semiconductor chip 1 may include a power MOSFET or a diode, and the effects described above are also achieved in either case. Further, the semiconductor chip 1 of the first preferred embodiment is not limited to a chip of a power device, but it may also be a chip of an LSI, for example.

<Second Preferred Embodiment>

FIG. 5 is a top view of the structure of a semiconductor chip provided in a semiconductor device of a second preferred embodiment of the present invention. Constituent elements of the semiconductor device of the second preferred embodiment that are similar to those of the semiconductor device of the first preferred embodiment are designated by the same reference numerals. Those parts considerably different from the first preferred embodiment are mainly described below.

As shown in FIG. 5, in the second preferred embodiment, the stress detecting element 7 described above for detecting stress applied to a central portion of a semiconductor chip 1 in plan view is provided as a first stress detecting element 7-1. Further, the stress detecting element 7 described above for detecting stress applied to a circumferential portion of the semiconductor chip 1 in plan view is provided as a second stress detecting element 7-2. The second stress detecting element 7-2 is placed at a corner section of the semiconductor chip 1. The first and second stress detecting elements 7-1 and 7-2 are both electrically insulated from emitter, gate and collector electrodes 4, 5 and 6 that are main electrodes of an IGBT.

The semiconductor chip 1 shown in FIG. 5 includes terminals 24, 25, 26, 27 and 28 provided for measuring the resistance values of piezoresistive elements 7-1a and 7-1b of the first stress detecting element 7-1, and those of piezoresistive elements 7-2a and 7-2b of the second stress detecting element 7-2. By way of example, the terminal 24 is a ground terminal. The terminal 25 is a terminal for measuring the resistance of the piezoresistive element 7-1a that detects stress applied in the direction of the X axis, and the terminal 26 is a terminal for measuring the resistance of the piezoresistive element 7-1b that detects stress applied in the direction of the Y axis. Likewise, the terminal 27 is a terminal for measuring the resistance of the piezoresistive element 7-2a that detects stress applied in the direction of the X axis, and the terminal 28 is a terminal for measuring the resistance of the piezoresistive element 7-2b that detects stress applied in the direction of the Y axis.

FIGS. 6A and 6B each show the circuit structure of the semiconductor device of the second preferred embodiment. The semiconductor device of the second preferred embodiment controls a gate signal to be applied to the gate electrode of a switching element 14 if a difference between stress detected by the first stress detecting element 7-1 and stress detected by the second stress detecting element 7-2 is higher than a predetermined threshold. The control of the gate signal mentioned here includes change of the level of the gate signal, or stop of application of the gate signal. In the second preferred embodiment, a control part 13 described in detail below is responsible for this control.

The control part 13 of the second preferred embodiment includes a stress acquiring part 13b for acquiring change in resistance corresponding to stress detected by the first stress detecting element 7-1 as voltage change $\Delta V1$, and a stress acquiring part 13c for acquiring change in resistance corresponding to stress detected by the second stress detecting element 7-2 as voltage change $\Delta V2$. Examples of the specific circuit structures of the stress acquiring parts 13b and 13c are shown in FIG. 6B. The control part 13 can monitor the changes of resistance values of the piezoresistive elements 7-1a, 7-1b, 7-2a and 7-2b by making the stress acquiring parts 13b and 13c acquire voltage changes during passage of a current, for example.

The control part 13 controls the gate signal of the switching element 14 if a difference $|\Delta V1 - \Delta V2|$ between the voltage change $\Delta V1$ acquired by the stress acquiring part 13b and the voltage change $\Delta V2$ acquired by the stress acquiring part 13c is higher than a fixed amount of voltage change (threshold voltage). Namely, the control part 13 controls the gate signal of the switching element 14 if a difference between stress detected by the first stress detecting element 7-1 and stress detected by the second stress detecting element 7-2 is higher than a predetermined threshold.

The control part 13 of the second preferred embodiment controls the gate signal of the switching element 14 if a difference between voltages responsive to stresses applied in the same direction which are two of the voltages of the piezoresistive elements 7-1a, 7-1b, 7-2a and 7-2b, is higher than the fixed amount of voltage change (threshold voltage). As an example, the gate signal of the switching element 14 is controlled if a difference between the voltage of the piezoresistive element 7-1a placed at the central portion of the semiconductor chip 1 in the direction of the X axis, and the voltage of the piezoresistive element 7-2a placed at the circumferential portion of the semiconductor chip 1 in the direction of the X axis, is higher than the fixed amount of voltage change (threshold voltage).

In the semiconductor device of the second preferred embodiment, stress applied to the semiconductor chip 1 can be measured even when the semiconductor chip 1 is conducting. Further, nonuniformity of electric characteristics is suppressed as stress can be measured in the plane of the semiconductor chip 1. Thus, the second preferred embodiment suppresses flow of a large current in a part of the semiconductor chip 1 subjected to application of high stress more reliably than the first preferred embodiment.

The second stress detecting element 7-2 of the second preferred embodiment is placed at a corner section of the semiconductor chip 1. This corner section is subjected to application of high stress as described above. So, variations of stress in the plane of the semiconductor chip 1 are detected with higher sensitivity.

<Third Preferred Embodiment>

The first preferred embodiment is intended to suppress nonuniformity of the electric characteristics and the like of the semiconductor chip 1 by making the stress detecting element 7 detect stress applied to the semiconductor chip 1 while the semiconductor chip 1 is conducting.

In contrast, in a third preferred embodiment of the present invention, the stress detecting element 7 does not detect stress while the semiconductor chip 1 is conducting, but detects stress before and after the semiconductor chip 1 is brought to a conducting state. By way of example, the resistance values (namely, stresses) of the piezoresistive elements 7a and 7b of the stress detecting element 7 are measured before the semiconductor chip 1 is brought to a conducting state. Next, a reliability test such as a long-time conduction test or a power cycle test is conducted that involves conduction of the semiconductor chip 1. After the test is finished, the resistance values (namely, stresses) of the piezoresistive elements 7a and 7b of the stress detecting element 7 are measured. The gate signal of the switching element 14 is controlled if a difference between the stresses detected by the stress detecting element 7 before and after the semiconductor chip 1 is brought to a conducting state is higher than a predetermined threshold.

The semiconductor device of the third preferred embodiment can detect rapid change in stress to be caused by generation of a crack in solder for joining the semiconductor chip 1 and a substrate during the reliability test and the like. Thus, the presence or absence of a crack in the solder can be determined. Determination as to expiration of lifetime of a product can also be made if a difference in stress is higher than a fixed value. Determination can also be made as to if quality degradation generated during the reliability test is due to stress, or failure during manufacture of chips.

The third preferred embodiment described above is applied to the first preferred embodiment. However, the third preferred embodiment achieves the same effect if it is applied to the second preferred embodiment.

<Fourth Preferred Embodiment>

FIG. 7 shows the types of resistor of a piezoresistive element, and the coefficients of resistance thereof in association with each other. FIG. 7 shows that sensitivity becomes higher as a coefficient of resistance increases.

In the preferred embodiments described above, the piezoresistive elements 7a, 7b, 7-1a, 7-1b, 7-2a and 7-2b (hereinafter called "piezoresistive element such as 7a") of the stress detecting elements 7, 7-1 and 7-2 (hereinafter called "stress detecting element such as 7") are not specifically discussed. A fourth preferred embodiment of the present invention specifically describes the structure of the piezoresistive element such as 7a.

As shown in FIG. 7, stress is detected with high sensitivity if the piezoresistive element such as 7a includes a diffusion layer 32 with implanted N-type impurities. So, in the fourth preferred embodiment, the piezoresistive element such as 7a includes the diffusion layer 32 with implanted N-type impurities.

As an example, as shown in FIG. 8, N-type impurities are implanted into a surface of a wafer 31 made of P-type silicon and on which a semiconductor chip 1 is provided to form the diffusion layer 32. Then, an insulating film 33 is formed on the diffusion layer 32, and a hole to partially expose the diffusion layer 32 is formed in the insulating film 33, thereby providing the piezoresistive element such as 7a.

As also shown in FIG. 7, stress is detected with high sensitivity if the piezoresistive element such as 7a includes a polysilicon layer 36 with implanted P-type impurities. So, in the fourth preferred embodiment, the piezoresistive element such as 7a includes the polysilicon layer 36 with implanted P-type impurities.

As an example, as shown in FIG. 9, the polysilicon layer 36 doped with P-type impurities is formed over a surface of the wafer 31 made of silicon and on which a semiconductor chip 1 is provided while an insulating film 35 is placed between the wafer 31 and the polysilicon layer 36. The insulating film 35 is formed to surround the polysilicon layer 36, and a hole to partially expose the polysilicon layer 36 is formed in the upper insulating film 35, thereby providing the piezoresistive element such as 7a.

FIG. 10 explains a relationship between the resistance value of the piezoresistive element such as 7a including the diffusion layer 32 and temperature. FIG. 11 explains a relationship between the resistance value of the piezoresistive element such as 7a including the polysilicon layer 36 and temperature.

The diffusion layer 32 has a junction. So, in the piezoresistive element such as 7a including the diffusion layer 32, dependency of a resistance on temperature shows some instability in a high-temperature condition of 250° C. or higher as shown in FIG. 10. Meanwhile, the polysilicon layer 36 does not have a junction unlike the diffusion layer 32. So, in the piezoresistive element such as 7a including the polysilicon layer 36, dependency of a resistance on temperature is stable in a high-temperature condition of 250° C. or higher as shown in FIG. 11. Thus, the piezoresistive element such as 7a including the diffusion layer 32 is expected to enhance sensitivity during stress detection for stress evaluation (mold formation, soldering, high-temperature reliability test) made in a high-temperature condition.

<Fifth Preferred Embodiment>

FIG. 12 is a top view of the structure of a semiconductor chip provided in a semiconductor device of a fifth preferred embodiment of the present invention. Constituent elements of the semiconductor device of the fifth preferred embodiment that are similar to those of the semiconductor device of the first preferred embodiment are designated by the same reference numerals. Those parts considerably different from the first preferred embodiment are mainly described below.

As shown in FIG. 12, a semiconductor chip 1 of the fifth preferred embodiment includes a central semiconductor chip 1a (transistor cell region 3 at a central portion) placed at a central portion of the semiconductor chip 1 in plan view, and a circumferential semiconductor chip 1b (transistor cell region 3 at a circumferential portion) placed on the outer side of the central semiconductor chip 1a in plan view.

The semiconductor chip 1 also includes a gate electrode 5a (central control electrode) for the central cell and which takes charge of the central semiconductor chip 1a, and a gate electrode 5b (circumferential control electrode) for the circumferential cell and which takes charge of the circumferential semiconductor chip 1b.

In the fifth preferred embodiment, a stress detecting element corresponding to the gate electrode 5a for the central cell and which detects stress applied to the central semiconductor chip 1a is provided as a first stress detecting element 7-3. A stress detecting element corresponding to the gate electrode 5b for the circumferential cell and which detects stress applied to the circumferential semiconductor chip 1b is provided as a second stress detecting element 7-4. The second stress detecting element 7-4 is placed at a corner section of the semiconductor chip 1. The first and second stress detecting elements 7-3 and 7-4 are both electrically insulated from emitter, gate and collector electrodes 4, 5 (5a, 5b) and 6 that are main electrodes of an IGBT.

The semiconductor chip 1 shown in FIG. 12 includes terminals 41, 42, 43, 44 and 45 provided for measuring the resistance values of piezoresistive elements 7-3a and 7-3b of the first stress detecting element 7-3, and those of piezoresistive elements 7-4a and 7-4b of the second stress detecting element 7-4. By way of example, the terminal 41 is a ground terminal. The terminal 42 is a terminal for measuring the resistance of the piezoresistive element 7-3a that detects stress applied in the direction of the X axis, and the terminal 43 is a terminal for measuring the resistance of the piezoresistive element 7-3b that detects stress applied in the direction of the Y axis. Likewise, the terminal 44 is a terminal for measuring the resistance of the piezoresistive element 7-4a that detects stress applied in the direction of the X axis, and the terminal 45 is a terminal for measuring the resistance of the piezoresistive element 7-4b that detects stress applied in the direction of the Y axis.

In the fifth preferred embodiment, a switching element 14 for controlling conduction of a load part 11 corresponding to the central semiconductor chip 1a is provided as a first switching element 14a. A switching element 14 for controlling conduction of a load part 11 corresponding to the circumferential semiconductor chip 1b is provided as a second switching element 14b. The gate signal of the first switching element 14a is controlled in response to stress detected by the first stress detecting element 7-3. The gate signal of the second switching element 14b is controlled in response to stress detected by the second stress detecting element 7-4. That is, the fifth preferred embodiment includes two circuits each of which has the circuit structure shown in FIG. 4B.

The semiconductor device of the fifth preferred embodiment more reliably suppresses nonuniformity of electric characteristics that vary in response to stress in the plane of the semiconductor chip 1. So, the fifth preferred embodiment suppresses flow of a large current in a specific part of the semiconductor chip 1 more reliably than the first preferred embodiment.

<Sixth Preferred Embodiment>

FIG. 13 is a sectional view of the structure of part of a semiconductor device of a sixth preferred embodiment of the present invention. As shown in FIG. 13, the semiconductor device of the sixth preferred embodiment includes a base plate 62 made of metal (here, copper) joined through solder 61 to the rear surface of a semiconductor chip 1, and a resin mold 63 housing the semiconductor chip 1 placed between the resin mold 63 and the base plate 62. For the sake of convenience, a bonding wire connected to the semiconductor chip 1 is not shown in FIG. 13.

FIG. 14 explains a relationship between steps of forming the structure shown in FIG. 13, and stress (compressive stress) applied to the semiconductor chip 1. As shown in FIG. 14, stress generated by difference in strength between the base plate 62, the solder 61 and the semiconductor chip 1, and stress generated by difference in strength between the resin mold 63 and the semiconductor chip 1 are accumulated to generate considerably high stress.

Meanwhile, as described above, the semiconductor devices of the first to fifth preferred embodiments suppress flow of a large current in a part of the semiconductor chip 1 subjected to application of high stress. So, these semiconductor devices are effectively applied especially in the structure of the sixth preferred embodiment where high stress is generated in the semiconductor chip 1.

<Seventh Preferred Embodiment>

A seventh preferred embodiment of the present invention relates to a method of testing a semiconductor device. First, a wafer with a semiconductor chip 1 of the seventh preferred embodiment similar to the semiconductor chip 1 of the second preferred embodiment is prepared.

FIG. 15 shows this wafer. As shown in FIG. 15, in the seventh preferred embodiment, a second stress detecting element 7-2 is formed on a surface of a dicing line 71 of the wafer, and the aforementioned terminals 24, 27 and 28 are also formed on the surface of the dicing line 71.

In the seventh preferred embodiment, the semiconductor chip 1 is tested after the wafer is prepared. The wafer is diced along a dicing line 71 after the test.

In the method of testing a semiconductor device of the seventh preferred embodiment, the second stress detecting element 7-2 is formed on the surface of the dicing line 71 that is an invalid region, so that area efficiency is enhanced. Terminals 24, 27 and 28 are also formed on the surface of the dicing line 71 in the seventh preferred embodiment, so that area efficiency is enhanced further.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor chip with a control electrode; and
a stress detecting element placed on a surface of said semiconductor chip, said stress detecting element detecting stress applied to the surface,
the semiconductor device controlling a control signal to be applied to said control electrode in response to stress detected by said stress detecting element, wherein said stress detecting element includes a piezoresistive element that changes in resistance in response to stress applied to the surface of said semiconductor chip,
wherein the semiconductor device is configured to control a control signal to be applied to said control electrode in response to stress detected by said stress detecting element, so as to reduce a current flowing in the semiconductor chip when a change in stress detected by the stress detecting element exceeds a predetermined value.

2. The semiconductor device according to claim 1, wherein said piezoresistive element has a diffusion layer with implanted N-type impurities.

3. The semiconductor device according to claim 1, wherein said piezoresistive element has a polysilicon layer with implanted P-type impurities.

4. The semiconductor device according to claim 1, wherein
said semiconductor chip includes a central control electrode and a circumferential control electrode, the central control electrode taking charge of a central portion of said semiconductor chip in plan view, the circumferential control electrode taking charge of a circumferential portion on the outer side of the central portion of said semiconductor chip in plan view,
said stress detecting element corresponding to said central control electrode is provided as a first stress detecting element, and
said stress detecting element corresponding to said circumferential control electrode is provided as a second stress detecting element.

5. The semiconductor device according to claim 1, further comprising:
a base plate made of metal and joined to the rear surface of said semiconductor chip through solder; and
a resin mold housing said semiconductor chip placed between the resin mold and said base plate.

6. The semiconductor device according to claim 1, wherein said semiconductor chip includes an IGBT or a power MOSFET.

7. The semiconductor device according to claim 1, wherein said semiconductor chip includes a diode.

8. The semiconductor device according to claim 1, wherein the change in stress is detected by a change in voltage across the stress detecting element.

9. A semiconductor device, comprising:
a semiconductor chip with a control electrode; and
a stress detecting element placed on a surface of said semiconductor chip, said stress detecting element detecting stress applied to the surface,
the semiconductor device controlling a control signal to be applied to said control electrode in response to stress detected by said stress detecting element, wherein said stress detecting element includes a piezoresistive element that changes in resistance in response to stress applied to the surface of said semiconductor chip, wherein
said stress detecting element detects said stress before and after said semiconductor chip is brought to a conducting state, and
the semiconductor device controls said control signal if a difference between stresses detected by said stress detecting element before and after said semiconductor chip is brought to a conducting state is higher than a predetermined threshold.

* * * * *